(12) United States Patent
Takahashi et al.

(10) Patent No.: US 7,973,405 B2
(45) Date of Patent: Jul. 5, 2011

(54) INTEGRATED CIRCUIT FOR DRIVING SEMICONDUCTOR DEVICE AND POWER CONVERTER

(75) Inventors: Yoshimasa Takahashi, Kyoto (JP); Naoki Sakurai, Hitachi (JP); Masashi Yura, Hitachinaka (JP); Masahiro Iwamura, Hitachi (JP); Mutsuhiro Mori, Mito (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 12/784,331

(22) Filed: May 20, 2010

(65) Prior Publication Data
US 2010/0225363 A1 Sep. 9, 2010

Related U.S. Application Data

(63) Continuation of application No. 10/545,021, filed as application No. PCT/JP2004/001555 on Feb. 13, 2004, now Pat. No. 7,763,974.

(30) Foreign Application Priority Data

Feb. 14, 2003 (JP) .................................. 2003-035931
Feb. 20, 2003 (JP) .................................. 2003-041980

(51) Int. Cl.
*H01L 23/34* (2006.01)
(52) U.S. Cl. ................ 257/724; 257/E25.029; 257/690; 257/723; 361/600; 438/107
(58) Field of Classification Search ............. 257/E25.03, 257/E23.052, E25.029, 723, 724, 718, 719, 257/692, 678, 684, 687, 690; 361/600, 736, 361/772, 728, 722, 801; 438/107, 109, 110; 327/109
See application file for complete search history.

(56) References Cited

U.S. PATENT DOCUMENTS
4,965,710 A 10/1990 Pelly et al.
(Continued)

FOREIGN PATENT DOCUMENTS
EP 0 791 961 A2 8/1997
(Continued)

OTHER PUBLICATIONS
Chinese Office Action dated Nov. 30, 2007 (Three (3) pages).
(Continued)

*Primary Examiner* — Chris Chu
(74) *Attorney, Agent, or Firm* — Crowell Moring LLP

(57) ABSTRACT

An integrated circuit for driving a semiconductor device, which is adaptable for demands, such as a higher output (larger current), a higher voltage, and a smaller loss, and has a small size, is produced at a low cost, and has high reliability. A power converter including such an integrated circuit is also provided. Circuit elements constituting a drive section of an upper arm drive circuit 212, a level shift circuit 20 including a current sensing circuit 210, a drive section of a lower arm drive circuit 222, and a drive signal processing circuit 224 are integrated and built in one high withstand voltage IC chip 200. Circuit elements constituting a final output stage buffer section 213 of the upper arm drive circuit 212 are built in a vertical p-channel MOS-FET chip 213p and a vertical n-channel MOS-FET chip 213n. Circuit elements constituting a final output stage buffer section 223 of the lower arm drive circuit 222 are built in a vertical p-channel MOS-FET chip 223p and a vertical n-channel MOS-FET chip 223n. Thus, a driver IC 2 is fabricated.

9 Claims, 14 Drawing Sheets

U.S. PATENT DOCUMENTS

| | | |
|---|---|---|
| 5,351,182 A | 9/1994 | Miyazaki et al. |
| 5,747,875 A | 5/1998 | Oshima |
| 5,767,573 A | 6/1998 | Noda et al. |
| 5,920,119 A * | 7/1999 | Tamba et al. ............ 257/718 |
| 6,137,705 A * | 10/2000 | Maekawa et al. ........... 363/132 |
| 6,154,372 A * | 11/2000 | Kalivas et al. ............ 361/784 |
| 6,313,598 B1 | 11/2001 | Tamba et al. |
| 6,320,448 B1 | 11/2001 | Gantioler |
| 6,442,033 B1 | 8/2002 | Liu et al. |
| 6,703,703 B2 * | 3/2004 | Grant ............................ 257/688 |
| 6,747,300 B2 | 6/2004 | Nadd et al. |
| 6,781,423 B1 | 8/2004 | Knoedgen |
| 6,987,670 B2 * | 1/2006 | Ahmed et al. ............ 361/699 |
| 7,061,080 B2 * | 6/2006 | Jeun et al. .................... 257/676 |
| 7,091,752 B2 | 8/2006 | Balakrishnan |
| 7,149,088 B2 * | 12/2006 | Lin et al. ..................... 361/704 |
| 7,268,596 B2 | 9/2007 | Ota et al. |
| 7,449,778 B2 * | 11/2008 | Sander ......................... 257/724 |
| 7,463,071 B2 | 12/2008 | Ribarich |
| 2002/0023341 A1 | 2/2002 | Lorenz et al. |
| 2002/0105769 A1 | 8/2002 | Sato et al. |

FOREIGN PATENT DOCUMENTS

| | | |
|---|---|---|
| JP | 57-52386 | 3/1982 |
| JP | 64-004058 | 1/1989 |
| JP | 64-013759 | 1/1989 |
| JP | 03-105944 | 5/1991 |
| JP | 05-316755 | 11/1993 |
| JP | 6-153533 A | 5/1994 |
| JP | 7-297698 A | 11/1995 |
| JP | 09-046201 | 2/1997 |
| JP | 9-247951 | 9/1997 |
| JP | 11-67947 A | 3/1999 |
| JP | 2000-32770 A | 1/2000 |
| JP | 2000-91499 | 3/2000 |
| JP | 2002-232280 | 8/2002 |

OTHER PUBLICATIONS

Japanese Office Action dated Oct. 14, 2008 (Two (2) pages).
An article entitled, "Hitachi High Withstand Voltage Monolithic IC Data Book—Motor Driving IC Series" by Hitachi, Ltd., Mar. 2001, pp. 113-116.
European Search Report dated Jul. 28, 2010 (Seven (7) pages).

* cited by examiner

ENLARGED VIEW OF PORTION C

INTEGRATED CIRCUIT FOR DRIVING SEMICONDUCTOR DEVICE AND POWER CONVERTER

This application is a continuation application of Ser. No. 10/545,021, filed May 8, 2006, now U.S. Pat. No. 7,763,974, which is a national stage of international application PCT/JP2004/001555, filed Feb. 13, 2004 which claims the priority of Japanese patent documents 2003-035931, filed Feb. 14, 2003 and 2003-041980, filed Feb. 20, 2003, the disclosures of which are expressly incorporated by reference herein.

BACKGROUND OF THE INVENTION

1. Technical Field

The present invention relates to an integrated circuit for driving semiconductor device, and a power converter including such an integrated circuit.

2. Background Art

A driver circuit for driving a semiconductor device is employed in all types of electric equipment and electronic equipment. As one example of the equipment, there is a power converter, e.g., an inverter for converting DC power supplied from a power supply to AC power, and supplying the AC power to an electric motor as a load. The driver circuit is made up of a plurality of circuit elements constituting a plurality of circuits, e.g., a circuit for generating a drive signal in accordance with an external command and a circuit for supplying drive power to the semiconductor device in according with the drive signal.

Hitherto, known driver circuits have been described, for example, in JP, A 5-316755 and "Hitachi High Withstand Voltage Monolithic IC Data Book—Motor Driving IC Series", by Hitachi Ltd., March 2001, pp. 113-116. The driver circuits described in those documents are applied to power converters, and a plurality of circuit elements are built in the same semiconductor chip in the integrated form. In other words, a plurality of circuit elements are produced in the form of a monolithic IC (Integrated Circuit) or a SoC (System on Chip) IC.

By thus producing the driver circuit in the IC form, the following advantages are obtained as compared with the case constituting the driver circuit on a printed circuit board by using a large number of individual parts (discrete parts). Namely, (1) a noticeable reduction in both the number of parts and size can be realized, (2) an intelligent chip can be easily realized with addition of, e.g., protective and diagnosis functions, (3) a delay in signal transmission can be reduced because the plurality of circuit elements are integrated in the same chip, and (4) a noticeable reduction of the cost can be achieved with the mass production effect. Therefore, endeavors of producing the driver circuit for the power converter in the IC form have been positively promoted in the field of products where a smaller size, a lower production cost, and higher reliability are demanded for the power converter, e.g., in the field of automobiles where AC electric motors are used as drive sources of electric vehicles and hybrid vehicles.

DISCLOSURE OF THE INVENTION

Recently, with the widespread use of driver circuits in the IC form, there have emerged new demands for the production of the driver circuits in the IC form. More specifically, new demands have been raised in realizing a higher output (larger current), a higher voltage, and a smaller loss of each driver circuit with the production of driver circuits in the IC form for use in electric equipment and electronic equipment operating at a higher output and a higher voltage than conventional ones, or with an increase of capacity and an improvement of fuel economy of power converters in the field of products, e.g., in the field of automobiles, where the production of driver circuits in the IC form has already been progressed. However, the endeavors of producing the driver circuits in the IC form have faced a limitation in meeting those demands.

Taking into account those situations, the inventors have made studies on the production of driver circuits in the IC form, which can meet the above-mentioned demands. With the intent to meet the above-mentioned demands, the inventors have first reviewed the problems encountered in the endeavors of producing the driver circuits in the IC form, which have been tried so far. As a result, the following problems have been found.

One problem with the known techniques for producing the driver circuits in the IC form is that a higher output of the driver circuit increases an area of a semiconductor chip and hence impedes a reduction of the chip size, which has been regarded as one advantage of the driver IC so far. The driver circuit has an output stage buffer section for supplying drive power to a semiconductor device. Usually, a horizontal MOS (Metal-Oxide-Semiconductor) type Field Effect Transistor (FET) (hereinafter referred to as a "MOS-FET") is used as a circuit element constituting the output stage buffer section. The horizontal MOS-FET is poorer in area efficiency than a vertical MOS-FET. As a result, the area of the output stage buffer section is increased with the higher output of the driver circuit. On the other hand, as disclosed in JP,A 64-4058, JP,A 64-13759, and JP,A 3-105944, it has been proposed to employ a vertical MOS-FET in the output stage buffer section to increase the area efficiency. However, when a current of output power from the driver circuit reaches several amperes (A), the area of the semiconductor chip must be increased for the purpose of reducing the on-resistance, and a proportion of the semiconductor chip area exceeds a half of the entire circuit area in some cases. Eventually, an increase in the area of the semiconductor chip not only causes a drop of the yield, but also increases the cost per semiconductor chip.

Another problem with the known techniques for producing the driver circuits in the IC form is that a higher output of the driver circuit increases a current change rate (di/dt) of the drive power supplied from the output stage buffer section to the semiconductor device through a wire and an external lead, and an influence of inductance residing in the wire and the external lead upon an output ability becomes not negligible. Such inductance can be reduced by arranging a circuit element constituting the output stage buffer section, which occupies a part of a semiconductor chip, on the semiconductor chip such that the inductance is reduced, but the necessity of that arrangement is one of restriction factors in design of the semiconductor chip. In an IC employing QFP (Quad Flat Package) as the package form, particularly, the inductance can be reduced with the arrangement enabling a current to be taken out through a path that provides a minimum distance between the semiconductor chip and the exterior. In spite of reducing the inductance with the above-described measures, however, the influence of the aforesaid inductance cannot be completely avoided with the known techniques for producing the driver circuits in the IC form.

Still another problem with the known techniques for producing the driver circuits in the IC form is that a higher output of the driver circuit increases a loss of heat generated in the output stage buffer section, and hence a portion generating a large amount of heat and a portion generating a comparatively small amount of heat are simultaneously present within the same semiconductor chip. The driver circuit has a circuit section for generating a drive signal in accordance with an external command. A drive section of the output stage buffer section receives the drive signal and drives the output stage buffer section. The circuit section for generating the drive signal is fabricated with a photolithographic process so as to reduce power consumption, and therefore generates a small amount of heat. On the other hand, the output stage buffer section delivers output power with a current of several amperes (A) and therefore generates a large amount of heat. Thus, because the lost heat is easily transferred from the high-temperature side toward the low-temperature side within the same semiconductor chip, a heat releasing ability on the high-temperature side must be increased. Stated another way, to cope with a condition where portions generating different amounts of heat are simultaneously present within the same semiconductor chip, it is required to prepare an optimum heat releasing design for each of the portions generating different amounts of heat. However, the known techniques for producing the driver circuits in the IC form have a difficulty in realizing such a design.

Still another problem with the known techniques for producing the driver circuits in the IC form is that a higher output of the driver circuit leads to the necessity of increasing the thickness of an oxide film coated for isolation within the same semiconductor chip and hence impedes a reduction of the chip cost, which has been regarded as one advantage of the driver IC so far. As methods for establishing isolation within the semiconductor chip, there are known, e.g., ones called JI (Junction Isolation), DI (Dielectric Isolation), and SoI (Silicon on Insulator). With the DI method, for example, an oxide film is interposed for isolation between poly-silicon (earth potential) serving as a support and a silicon single-crystal in which respective layers of circuit elements are formed, and between each electrode of the circuit elements and the not corresponding layer in the silicon single-crystal. However, when the driver circuit has the withstand voltage over several hundreds volts (V) with a higher output thereof, the thickness of the oxide film must be increased. Because of the necessity of increasing the thickness of the oxide film, in the known driver circuits in the IC form, the time required for the production process of the semiconductor chip is prolonged and the yield is reduced. Accordingly, the known techniques for producing the driver circuits in the IC form push up the cost of the semiconductor chip.

Furthermore, with the known techniques for producing the driver circuits in the IC form, a high-voltage circuit and a low-voltage circuit are present within the same semiconductor chip in a state both the circuits are coupled to each other through parasitic capacitance. In such a case, when a voltage change rate (dv/dt) within the semiconductor chip increases with a higher voltage of the driver circuit, this results in a higher probability that the IC may malfunction due to a current caused by the parasitic capacitance. In the known driver circuits in the IC form, therefore, circuit elements in the semiconductor chip must be rearranged into an optimum layout, taking into account the parasitic capacitance. Thus, the known techniques for producing the driver circuits in the IC form require a long period for development of a new IC adapted for a higher voltage of the driver circuit.

Additionally, in a method of driving IGBT, control has hitherto been made while gate resistance is kept fixed. On the other hand, JP,A 9-46201, for example, discloses a control method of changing the gate resistance to a proper value in a state where a plurality of elements are in the turning-on operation, for the purpose of cutting the turning-on loss and reducing the time change rate di/dt of a main current at the time of turning-on.

However, because a circuit is complicated and the use of discrete elements increases a delay, it has been difficult to realize optimum control up to now.

The inventors have made studies on the production of the driver circuits in the IC form, which can overcome the thus-extracted problems and meet the above-mentioned demands. As a result, the inventors have found that the thus-extracted problems can be overcome and the above-mentioned demands can be met by, instead of fabricating the driver circuit in the form of a monolithic IC or SoC IC as endeavored in the past, fabricating the driver circuit in the form of the so-called SiP (System in Package) IC, i.e., by optimally separating a plurality of circuit elements constituting a plurality of circuits depending on levels of current, power loss, voltage, required withstand voltage, etc., and integrating a plurality of circuits belonging to each of the levels to be built in a separate semiconductor chip for each level.

Accordingly, an object of the present invention is to provide an integrated circuit for driving a semiconductor device, which is adaptable for demands, such as a higher output (larger current), a higher voltage, and a smaller loss, and has a small size, is produced at a low cost, and has high reliability. Another object of the present invention is to provide an integrated circuit for driving a semiconductor device, which can overcome any or all of the above-mentioned problems. Still another object of the present invention is to provide a power converter including, as a driver circuit, the integrated circuit for driving the semiconductor device.

In the integrated circuit for driving a semiconductor device, in which a plurality of circuit elements are integrated for driving of the semiconductor device, the circuit is constructed such that at least circuit elements for supplying drive power to the semiconductor device are built in a semiconductor chip separate from a semiconductor chip in which other circuit elements are built in.

The power converter comprises a module section including a semiconductor device for power conversion, and a control section including a driver circuit for driving the semiconductor device. The driver circuit is constructed as an integrated circuit in which a plurality of circuit elements are integrated, and at least circuit elements for supplying drive power to the semiconductor device are built in a semiconductor chip separate from a semiconductor chip in which other circuit elements are built in.

According to the present invention, since an integrated circuit is constructed in the form of an SiC (System in Package) IC by building at least circuit elements for supplying drive power to the semiconductor device in a semiconductor chip separate from a semiconductor chip in which other circuit elements are built in, it is possible to overcome the problems with the known monolithic IC or SoC IC, such as an increase in chip area, development period and cost of the semiconductor chip with a higher output of the driver circuit, as well as deterioration in reliability of noise immunity.

BEST MODE FOR CARRYING OUT THE INVENTION

Figure 1:
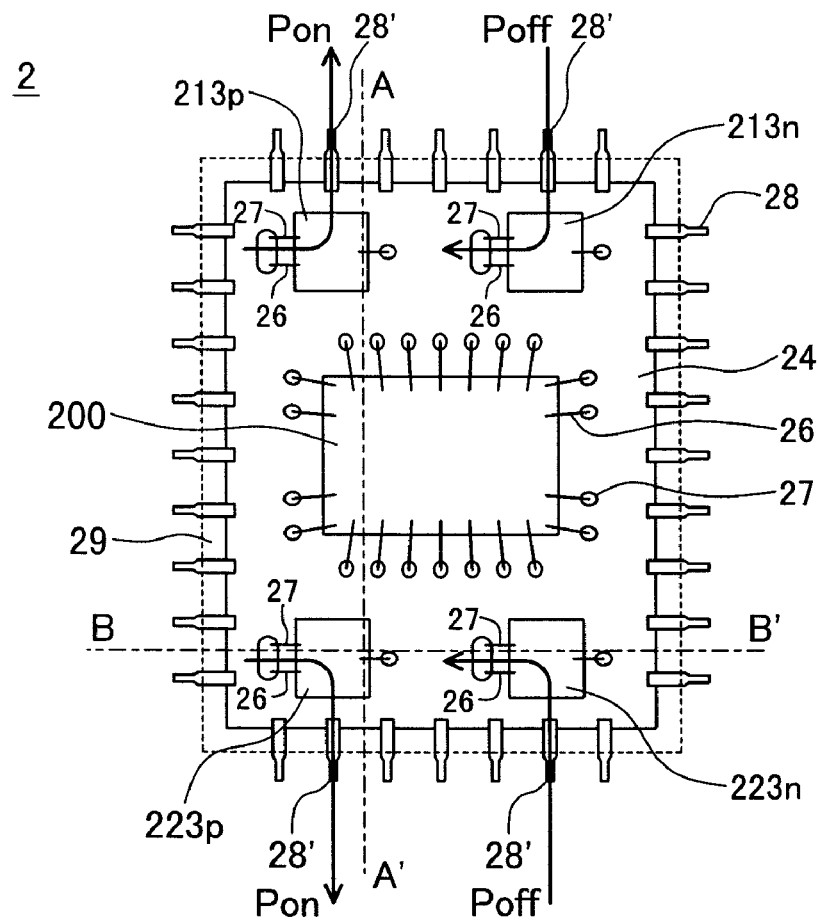
FIG. 1 is a plan view showing the mount layout of a driver IC according to a first embodiment of the present invention.
Figure 2:
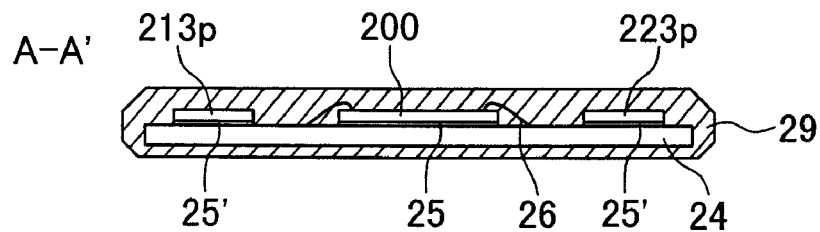
FIG. 2 is a sectional view taken along the line A-A' in FIG. 1.
Figure 3:
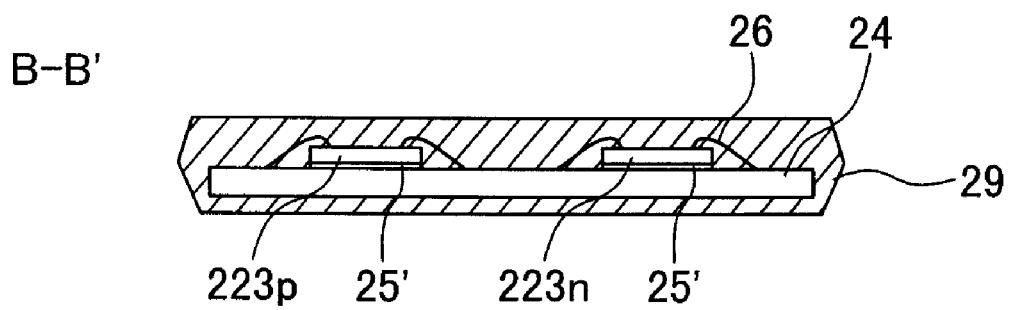
FIG. 3 is a sectional view taken along the line B-B' in FIG. 1.
Figure 4:
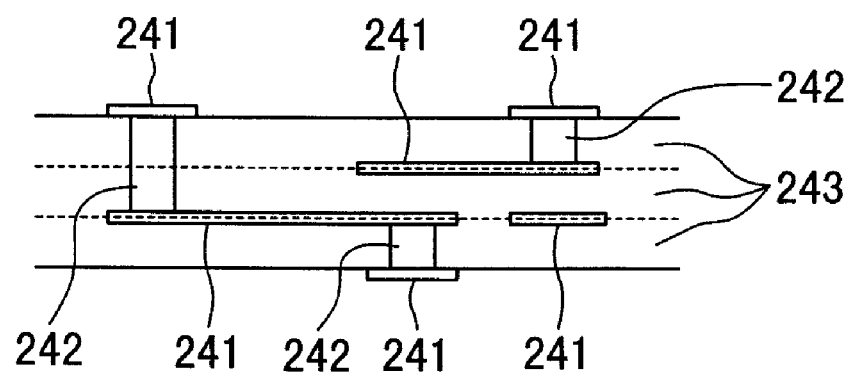
FIG. 4 is a sectional view showing the construction of an isolation wiring board of the driver IC shown in FIG. 1.
Figure 5:
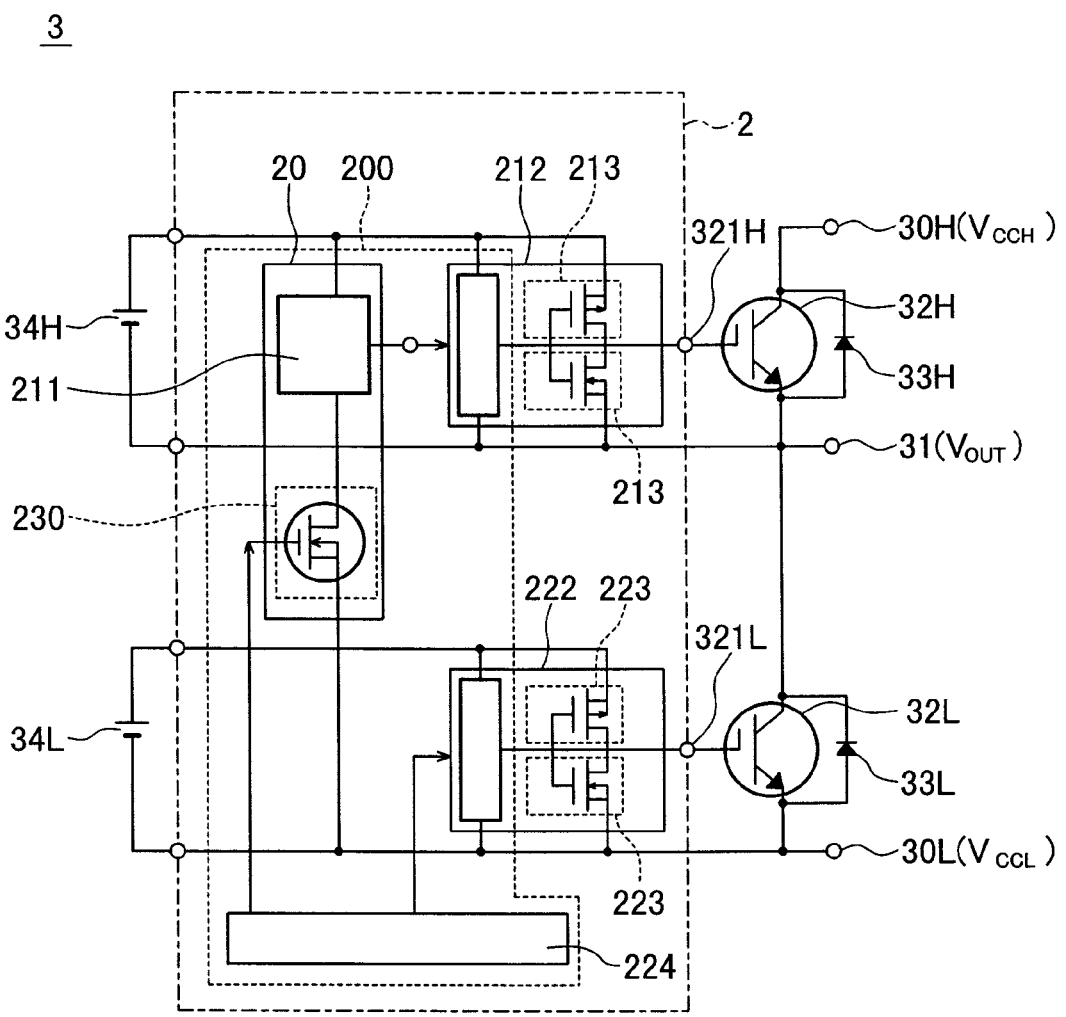
FIG. 5 is a circuit block diagram showing the circuit arrangement of the driver IC shown in FIG. 1.
Figure 6:
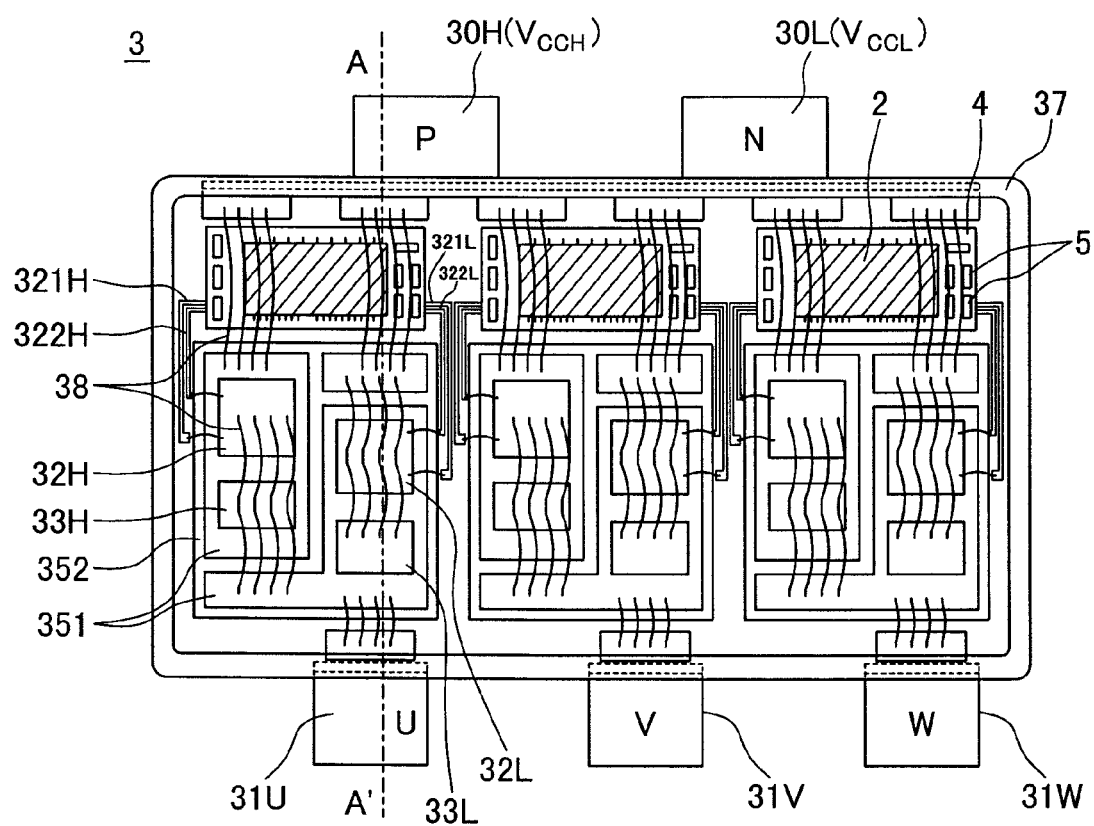
FIG. 6 is a plan view showing the mount layout of an inverter in which the driver IC shown in FIG. 1 is mounted as a driver circuit.
Figure 7:
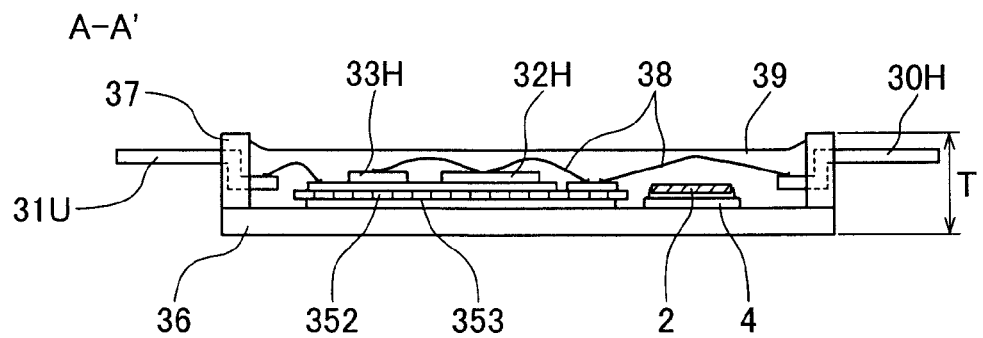
FIG. 7 is a sectional view taken along the line A-A' in FIG. 6.

A first embodiment of the present invention will be described below with reference to FIGS. 1 through 7. FIGS. 1 through 3 show the construction of a driver IC of this embodiment. FIG. 4 shows the construction of an isolation wiring board in the driver IC of this embodiment. FIG. 5 shows the circuit arrangement of the driver IC of this embodiment. FIGS. 6 and 7 show the construction of an inverter of this embodiment. The inverter of this embodiment is a power converter for use with an electric equipment driving system mounted in electrically powered vehicles, such as an electric vehicle in which an electric motor is employed as only one drive source for the vehicle, and a hybrid vehicle in which an engine, i.e., an internal combustion engine, and an electric motor are both employed as drive sources for the vehicle. The inverter converts DC power supplied from an onboard power supply, i.e., a battery, to AC power and supplies the AC power to an AC electric motor (e.g., an induction motor or a synchronous motor).

An inverter 3 comprises a power module section, which constitutes a conversion circuit for converting the DC power supplied from the battery to the AC powers, and a control section to drive the conversion circuit of the power module section. The conversion circuit of the power module section is constructed such that a one-phase (one-arm) circuit comprising two Insulated Gate Bipolar Transistors (hereinafter abbreviated to "IGBT"), serving as power conversion semiconductor devices (power switching devices), which are electrically connected in series, is disposed for each of three phases (three arms), i.e., U phase, V phase and W phase, and the three one-phase circuits are electrically connected to the battery in parallel. Between the two IGBT's of each arm, the input side of an AC load in the corresponding phase is electrically connected.

In an actual hardware configuration, for each phase, a pair of an upper arm IGBT chip 32H and a corresponding return diode chip 33H, and a pair of a lower arm IGBT chip 32L and a corresponding return diode chip 33L are fixed to respective wiring patterns 351 on a ceramic isolation substrate 352 by soldering. Resulting assemblies of those components are fixed to a base plate 36 (heat sink) of a case 37 side by side by soldering. A positive-pole main power supply terminal 30H and a negative-pole main power supply terminal 30L each electrically connected to the battery are embedded in one side of the case 37 in the lengthwise direction thereof. An output terminal 31U to which the U phase input side of the motor as a load is electrically connected, an output terminal 31V to which the V phase input side of the motor is electrically connected, and an output terminal 31W to which the W phase input side of the motor is electrically connected, are embedded in the other side of the case 37 in the lengthwise direction thereof. Those terminals are projected out of the case 37 in opposite relation in the direction of the short side of the case 37.

The positive-pole main power supply terminal 30H is electrically connected for each phase by wires 38 to the wiring pattern 351 to which the upper arm IGBT chip 32H is fixed. The negative-pole main power supply terminal 30L is electrically connected for each phase by wires 38 to the wiring pattern 351 to which the lower arm IGBT chip 32L is fixed. The output terminal 31U is electrically connected by wires 38 to the wiring pattern 351 to which the U-phase lower arm IGBT chip 32L is fixed and to which the U-phase upper arm IGBT chip 32H is electrically connected by wires 38. The output terminal 31V is electrically connected by wires 38 to the wiring pattern 351 to which the V-phase lower arm IGBT chip 32L is fixed and to which the V-phase upper arm IGBT chip 32H is electrically connected by wires 38. The output terminal 31W is electrically connected by wires 38 to the wiring pattern 351 to which the W-phase lower arm IGBT chip 32L is fixed and to which the W-phase upper arm IGBT chip 32H is electrically connected by wires 38.

In a position on the base plate 36 opposing to the converter circuit for each phase, a wiring board 4 including passive parts 5 and a driver IC 2 fixed thereto is disposed in opposite relation to the converter circuit for each phase. Further, for each phase, the driver IC 2 and the upper arm IGBT chip 32H are electrically connected to each other through drive signal wiring 321H and current detection wiring 322H both disposed on the base plate 36, while the driver IC 2 and the lower arm IGBT chip 32L are electrically connected to each other through drive signal wiring 321L and current detection wiring 322L. A silicone resin 39 is filled in the case 37 by potting.

The ceramic isolation substrate 352 includes the wiring patterns 351 fixed to a front surface thereof and a metallized layer 353 fixed to a rear surface thereof. A material of the ceramic isolation substrate 352 is preferably one having high thermal conductivity, such as aluminum nitride, but it may be alumina, silicon nitride or the like. A material of the base plate 36 is preferably one having superior thermal conductivity and being available at a low cost, such as Cu (copper). In consideration of reliability in solder connection with respect to the ceramic isolation substrate 352, however, any other suitable materials, such as Mo (molybdenum), Cu—Mo, an Al/SiC composite material, and a Cu/Cu$_2$O composite material are also usable. A printed wiring board or a ceramic wiring board is used as the wiring board 4.

The circuit arrangement of the driver IC 2 will be described below. As shown in FIG. 5, the collector of a first power switching device (upper arm IGBT chip 32H) is electrically connected to a high-voltage terminal 30H (positive pole side at a potential V$_{CCH}$) of the main power supply (battery). The emitter of a second power switching device (lower arm IGBT chip 32L) is electrically connected to a ground terminal 30L (negative pole side at a potential V$_{CCL}$) of the main power supply (battery). A first return diode (upper arm return diode chip 33H) is electrically connected between the emitter and the collector of the first power switching device. A second return diode (lower arm return diode chip 33L) is electrically connected between the emitter and the collector of the second power switching device. The emitter of the first power switching device and the collector of the second power switching device are electrically connected in series, and a junction between them is electrically connected to an output terminal 31 (potential V$_{OUT}$) of the inverter 3.

While this embodiment employs IGBT as each of the first power switching device and second power switching device, MOS-FET may be used instead of the TGBT.

An upper arm drive circuit 212 is electrically connected to a gate terminal 321H of the gate of the first power switching device, and a lower arm drive circuit 222 is electrically connected to a gate terminal 321L of the gate of the second power switching device. The positive pole side and the negative pole side of a power supply 34L, which is connected at the negative pole side to the ground terminal 30L (negative pole side) of the main power supply (battery), are electrically connected to the positive pole side and the negative pole side of the lower arm drive circuit 222, respectively. DC power outputted from the power supply 34L is supplied to the lower arm drive circuit 222.

The emitter of the first power switching device is connected to the output terminal 31 of the inverter 3. The first power switching device is therefore in a potentially floating state with respect to the ground terminal 30L (negative pole side) of the main power supply (battery). Accordingly, the upper arm drive circuit 212 and a power supply 34H are isolated from each other by a circuit element for isolation (not shown), such as a transformer. The positive pole side and the negative pole side of the power supply 34H, which is connected at the negative pole side to the output terminal 31 of the inverter 3, are electrically connected to the positive pole side and the negative pole side of the upper arm drive circuit 212, respectively. DC power outputted from the power supply 34H is supplied to the upper arm drive circuit 212 through the circuit element for isolation.

A drive signal processing circuit 224 receives an input command outputted from an external controller (not shown) and then generates and outputs respective drive signals for a drive section (not shown) of the upper arm drive circuit 212 and a drive section (not shown) of the lower arm drive circuit 222. The drive section of the lower arm drive circuit 222 receives the drive signal outputted from the drive signal processing circuit 224 and then generates and outputs a drive signal for driving a final output stage buffer section 223. The final output stage buffer section 223 receives the drive signal outputted from the drive section and supplies predetermined drive power to a gate terminal 321L, thereby outputting drive power to turn on the second power switching device.

On the other hand, the drive signal outputted from the drive signal processing circuit 224 to the upper arm drive circuit 212 is supplied to the drive section of the upper arm drive circuit 212 after being converted to a predetermined voltage (after voltage step-up) through a level shift circuit 20. The drive section of the upper arm drive circuit 212 receives the drive signal outputted from the level shift circuit 20 and then generates and outputs a drive signal for driving a final output stage buffer section 213. The final output stage buffer section 213 receives the drive signal outputted from the drive section and supplies predetermined drive power to a gate terminal 321H, thereby outputting drive power to turn on the first power switching device.

Incidentally, an electrical magnitude of the first power switching device is decided depending on the current capacity (driving ability) of the final output stage buffer section 213, and an electrical magnitude of the second power switching device is decided depending on the current capacity (driving ability) of the final output stage buffer section 223.

In the known driver IC, a plurality of circuit elements constituting the upper arm drive circuit 212 including the level shift circuit 20 and the final output stage buffer section 213, the lower arm drive circuit 222 including the final output stage buffer section 223, and the drive signal processing circuit 224 are integrated and built in the same semiconductor chip. Stated another way, the known driver IC is produced in the form of a monolithic IC or SoC IC. In contrast, according to this embodiment, the driver circuit is produced in the IC form of the so-called SiP type by optimally separating a plurality of circuit elements depending on their power levels (e.g., current capacities), and integrating a plurality of circuit elements belonging to each of predetermined power levels to be built in separate semiconductor chips for each level. Stated another way, according to this embodiment, the circuit elements constituting the drive section of the upper arm drive circuit 212, the level shift circuit 20 including a current sensing circuit 211, the drive section of the lower arm drive circuit 222, and the drive signal processing circuit 224 are integrated and built in one high withstand voltage IC chip 200. The circuit elements constituting the final output stage buffer section 213 of the upper arm drive circuit 212 are built in a vertical p-channel MOS-FET chip 213p and a vertical n-channel MOS-FET chip 213n. The circuit elements constituting the final output stage buffer section 223 of the lower arm drive circuit 222 are built in a vertical p-channel MOS-FET chip 223p and a vertical n-channel MOS-FET chip 223n. Thus, the driver IC 2 is fabricated.

Note that, in FIG. 5, a one-dot-chain line represents a region of the driver IC 2, and a broken line represents a region of each semiconductor chip.

The mount layout of the driver IC 2 of this embodiment will be described below. As shown in FIGS. 1 through 4, the high withstand voltage IC chip 200 is disposed substantially at the center of the isolation wiring board 24 having a rectangular shape, and is fixed onto the isolation wiring board 24 by a connecting member 25. Further, the high withstand voltage IC chip 200 is electrically connected by wires 26 to a plurality of bonding pads 27 exposed on the surface of the isolation wiring board 24.

The MOS-FET chips 213n, 213p are disposed in one lateral end portion of the rectangular isolation wiring board 24 in the lengthwise direction thereof in opposite relation to the high withstand voltage IC chip 200 such that the chips 213n, 213p are arranged side by side along the high withstand voltage IC chip 200 in the direction of a short side of the isolation wiring board 24. Further, the MOS-FET chips 213n, 213p are fixed onto the isolation wiring board 24 by a connecting member 25' and are electrically connected by wires 26 to a plurality of bonding pads 27 exposed on the surface of the isolation wiring board 24.

The MOS-FET chips 223n, 223p are disposed in the other lateral end portion of the rectangular isolation wiring board 24 in the lengthwise direction thereof in opposite relation to the high withstand voltage IC chip 200 such that the chips 223n, 223p are arranged side by side along the high withstand voltage IC chip 200 in the direction of the short side of the isolation wiring board 24. Further, the MOS-FET chips 223n, 223p are fixed onto the isolation wiring board 24 by a connecting member 25' and are electrically connected by wires 26 to a plurality of bonding pads 27 exposed on the surface of the isolation wiring board 24.

By arranging the MOS-FET chips 213n, 213p, 223n and 223p on the isolation wiring board 24 as described above, the distance from each chip to a corresponding external output terminal 28' is minimized. Thus, in this embodiment, those MOS-FET chips are arranged near the external output terminals 28' so that they are positioned close to the external output terminals 28'.

Furthermore, in this embodiment, because the driver IC 2 generates a large output current, the respective sources (on the surface side of the semiconductor chip) of the MOS-FET chips 213n, 213p, 223n and 223p are each electrically connected to a bonding pad 27 on the isolation wiring board 24 by a plurality of wires 26 extending in parallel. Also, each chip is constituted as a bare chip (naked chip).

A plurality of external output terminals 28 are fixed to the isolation wiring board 24 by connecting members (not shown) and are electrically connected to the isolation wiring board 24. A structure including the semiconductor chips, the isolation wiring board 24, and the plurality of external output terminals 28 is molded and packaged in a sealing-off member 29 such that the plurality of external output terminals 28 are partly exposed to the outside. In FIG. 1, the contour of the sealing-off member 29 is indicated by a broken line to make the mount layout within the driver IC 2 understandable.

The isolation wiring board 24 is, as shown in FIG. 4, a multi-layered wiring board. In this embodiment, the multi-layered wiring board is formed of a three-layered wiring board made of a glass ceramic and using an Ag (silver) conductor as a wiring conductor 241. The wiring conductors 241 in respective ceramic layers 243 are electrically connected to each other through via holes 242. The wiring conductor 241 is formed of a noble metal conductor such as an Ag—Pt (platinum) conductor or an Ag—Pd (palladium) conductor, or a base metal conductor such as a Ni (nickel) conductor or a Cu (copper) conductor. The ceramic layer 243 is made of an oxide such as alumina, or a nitride such as aluminum nitride. Any of other suitable insulating ceramics is also usable. Further, to reduce the cost, a resin-made multi-layered isolation board made of glass epoxy, for example, may be used as the isolation wiring board 24 in this embodiment.

The connecting members 25, 25' are each made of a solder, an Ag paste, or the like. The wires 26 are each made of gold, aluminum, or the like. By selecting one unified kind of the material and diameter as the wires 26, it is possible to increase the efficiency of a bonding step. Alternatively, different kinds of wires may be used, as appropriate, if the material and diameter of the wire require to be selected separately depending on positions where the wires are used.

The molding with the sealing-off member 29 serves mainly to protect the fixed portions and the bonding portions against not only a hot and humid atmosphere during storage or operation of the driver IC 2 after assembly, but also mechanical and thermal impacts during transportation and the operation. The sealing-off member 29 is made of an insulating material such as an epoxy resin. In this embodiment, transfer molding is utilized to mold the structure, which includes the semiconductor chips, the isolation wiring board 24, and the plurality of external output terminals 28, in the epoxy resin mixed with a silica filler. As an alternative, the sealing-off may be performed such that the sealing-off member 29 is applied by potting to only the surface of the isolation wiring board 24 on which the parts are mounted.

In the driver IC 2 of this embodiment, as indicated by an arrow Pon in FIG. 1, when turning on the first power switching device, a current is supplied to the first power switching device from a power supply wiring conductor (not shown) built in the isolation wiring board 24 after flowing through the wires 26, the MOS-FET chip 213p, the wire 26, a wiring conductor (not shown) built in the isolation wiring board 24, the external output terminal 28, and the gate terminal 321H in the order mentioned above. Thus, the first power switching device is brought into a turned-on state. Similarly, as indicated by an arrow Pon in FIG. 1, when turning on the second power switching device, a current is supplied to the second power switching device from a power supply wiring conductor (not shown) built in the isolation wiring board 24 after flowing through the wires 26, the MOS-FET chip 223p, the wire 26, a wiring conductor (not shown) built in the isolation wiring board 24, the external output terminal 28, and the gate terminal 321L in the order mentioned above. Thus, the second power switching device is brought into a turned-on state.

On the other hand, as indicated by an arrow Poff in FIG. 1, when turning off the first power switching device, a current flows from the gate terminal 321H through the external output terminal 28, a wiring conductor (not shown) built in the isolation wiring board 24, the wire 26, the MOS-FET chip 213n, the wires 26, and a ground wiring conductor (not shown) built in the isolation wiring board 24 in the order mentioned above. Thus, the first power switching device is brought into a turned-off state. Similarly, as indicated by an arrow Poff in FIG. 1, when turning off the second power switching device, a current flows from the gate terminal 321L through the external output terminal 28, a wiring conductor (not shown) built in the isolation wiring board 24, the wire 26, the MOS-FET chip 223n, the wires 26, and a ground wiring conductor (not shown) built in the isolation wiring board 24 in the order mentioned above. Thus, the second power switching device is brought into a turned-off state.

With this embodiment described above, since the circuit elements constituting the final output stage buffer section 213 are built in the MOS-FET chips 213p, 213n and the circuit elements constituting the final output stage buffer section 223 are built in the MOS-FET chips 223p, 223n separately from the high withstand voltage IC chip 200, the flexibility in layout of the MOS-FET chips 213p, 213n, 223p and 223n can be increased. With this embodiment, therefore, the MOS-FET chips 213p, 213n, 223p and 223n can be arranged on the isolation wiring board 24 such that the distance between each chip and the external output terminal 28' is minimized. Accordingly, this embodiment can always hold minimum the length of a conduction path of the output current within the driver IC 2. As a result, it is possible to reduce the value of inductance on the current path as compared with that in the known driver circuit in the IC form, and to suppress a lowering of the output current, which is caused by the presence of inductance. In addition, experiments conducted by the inventors have proved that the value of inductance on the current path can be reduced to about $\frac{1}{5}$ of that in the known driver circuit in the IC form.

Also, with this embodiment, since the MOS-FET chips are each constructed as a vertical chip, the area of the semiconductor chip assigned as each of the final output stage buffer sections 213, 223 can be reduced as compared with that in the known driver circuit in the IC form. Experiments conducted by the inventors have proved that, on condition of the same on-resistance, the area of the semiconductor chip can be reduced to about 45% of that in the known driver circuit in the IC form. Conversely speaking, assuming that the area assigned to the semiconductor chip is the same, the on-resistance can be noticeably reduced and the power loss can be reduced correspondingly.

Further, with this embodiment, since the final output stage buffer sections 213, 223 are separated from the high withstand voltage IC chip 200, the heat is prevented from being directly transferred to the high withstand voltage IC chip 200 from the final output stage buffer sections 213, 223 which generate relatively large amounts of heat due to their power losses, and operation stability in the state of temperature rising to a high level can be improved as compared with that in the known driver circuit in the IC form. With this embodiment, therefore, it is possible to increase the driving ability of the driver IC 2, and to realize production of a driver circuit operating at an output current of 10 A or above in the IC form operating at a lower cost, which has required an increased cost and has faced a difficulty in ensuring operation stability with that the known driver circuit in the IC form.

Moreover, with this embodiment, since the above-described driver IC 2 is used as a driver circuit for a high output and a high voltage (e.g., 10 A and 1700 V), such a driver circuit can be mounted in a module section of the inverter 3. With this embodiment, therefore, a mount area of the driver circuit can be reduced as compared with that in the known inverter. Accordingly, this embodiment can realize a reduction in size and cost of the inverter 3. In addition, with this embodiment, since a height T of the inverter 3 can be reduced, it is possible to reduce the volume of the inverter 3 and to reduce the overall size of the inverter 3. As still another advantage of this embodiment, the reduction in size of the driver circuit contributes to increasing the resistance against EMI (Electro Magnetic Interference). As a result, with this embodiment, the probability of malfunction caused by noises can be reduced in spite of the operation at a high voltage of 1700 V, and the inverter 3 having high reliability can be provided.

While this embodiment is described above in connection with a 3-phase inverter, similar advantages can also be obtained with a single-phase inverter.

Embodiment 2

Figure 11:
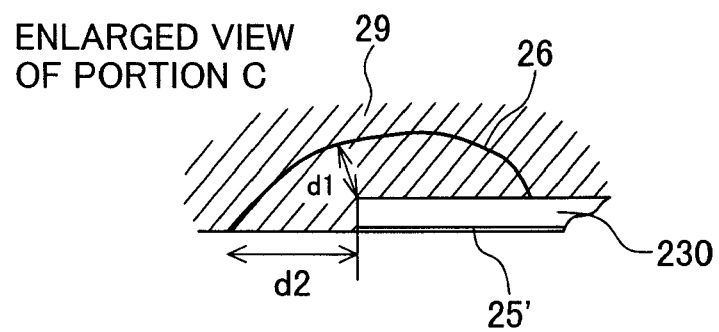
FIG. 11 is an enlarged sectional view of a portion C in FIG. 10.
Figure 12:
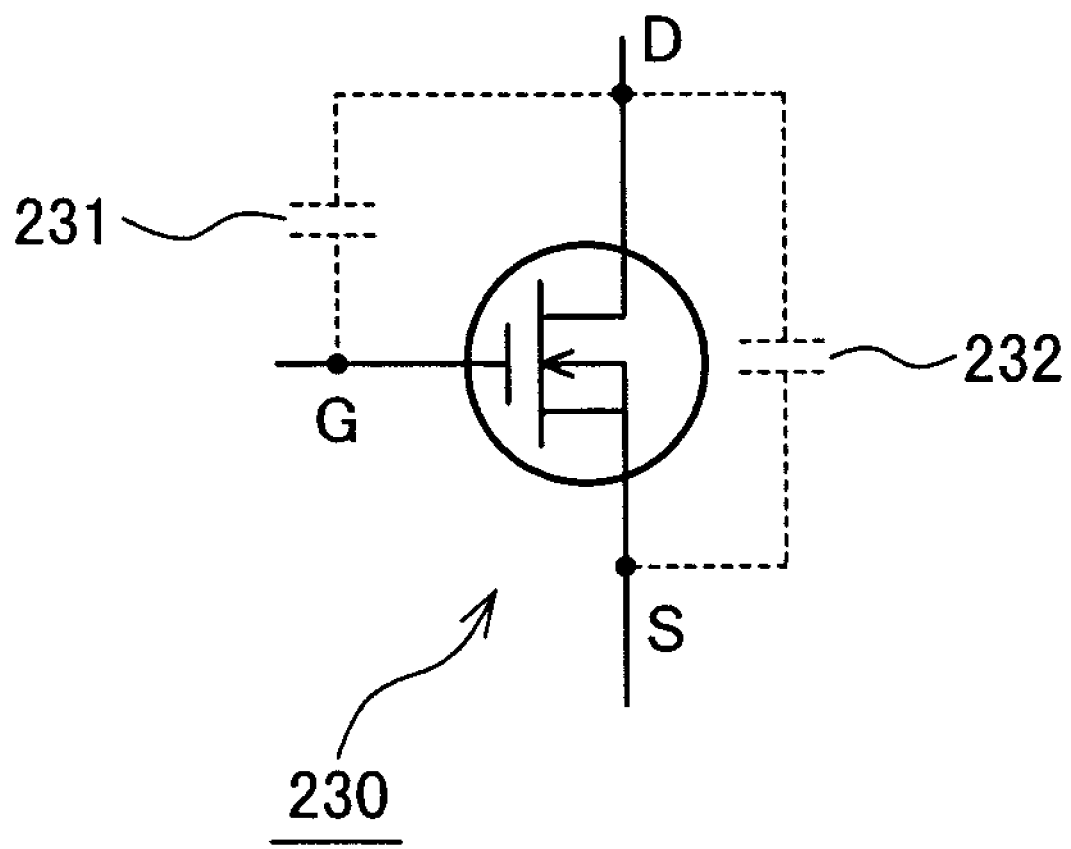
FIG. 12 is a circuit diagram showing parasitic capacitance in a level shift circuit of the driver IC shown in FIG. 8.
Figure 13:
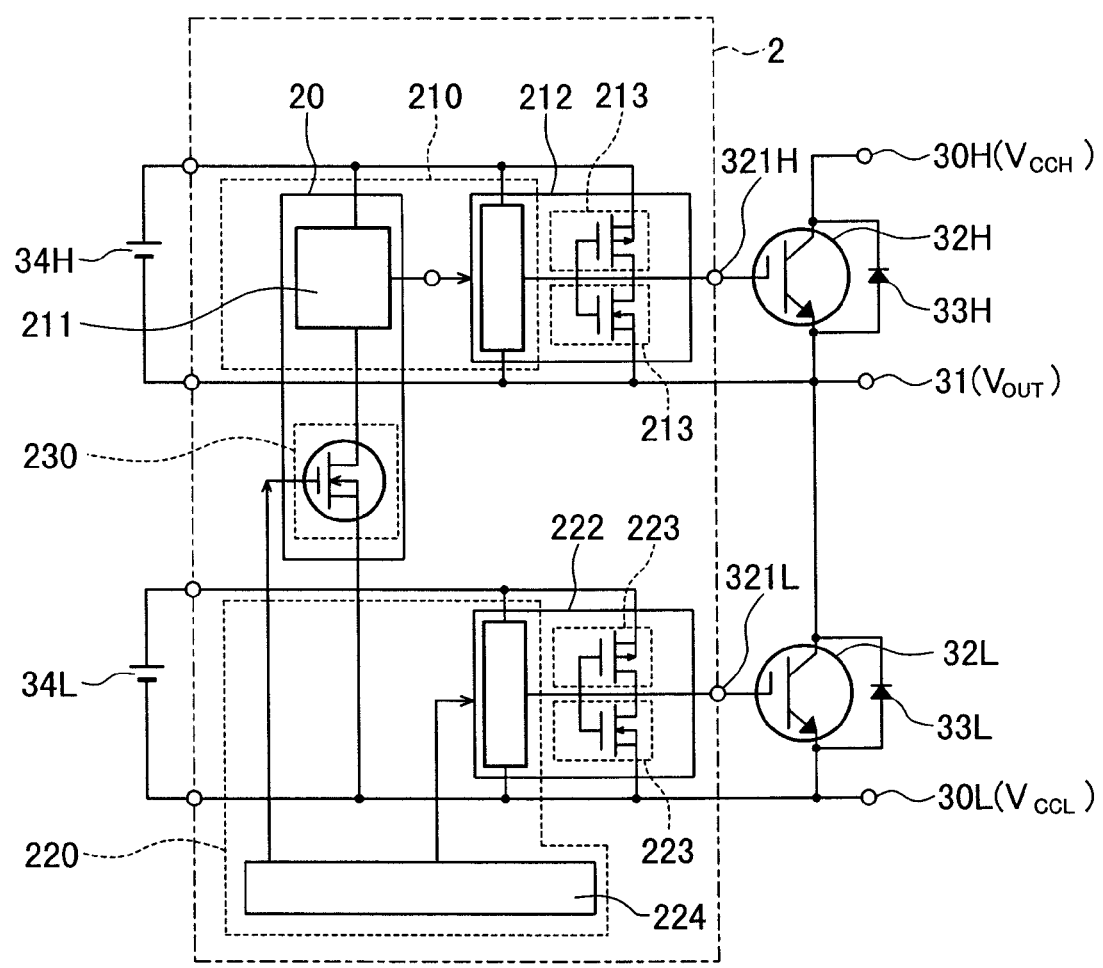
FIG. 13 is a circuit block diagram showing the circuit arrangement of the driver IC shown in FIG. 8.

A second embodiment of the present invention will be described with reference to FIGS. 8 through 13. FIGS. 8 through 11 show the construction of a driver IC of this embodiment. FIG. 12 shows parasitic capacitance in a level shift circuit of the driver IC of this embodiment. FIG. 13 shows the circuit arrangement of the driver IC of this embodiment. In the following, only the construction differing from that of the above-mentioned embodiment will be described and a description of the remaining similar construction is omitted.

This embodiment is a modification of the first embodiment. In addition to the final output stage buffer sections 213, 223 being built in separate chips, the circuit elements constituting the level shift circuit 20 are also built in separate chips. Further, the high withstand voltage IC chip 200 is separated into a high voltage section and a low voltage section, which are built in separate chips. More specifically, in this embodiment, circuit elements constituting the drive section of the upper arm drive circuit 212 and a current sensing circuit 211 of the level shift circuit 20 are built in an upper arm IC chip 210. Circuit elements constituting the drive section of the lower arm drive circuit 222 and the drive signal processing circuit 224 are built in a lower arm IC chip 220. Circuit elements constituting the level shift circuit 20 are built in a vertical n-channel MOS-FET chip 230.

The circuit elements constituting the final output stage buffer section 213 of the upper arm drive circuit 212 are built in the vertical p-channel MOS-FET chip 213p and the vertical n-channel MOS-FET chip 213n. The circuit elements constituting the final output stage buffer section 223 of the lower arm drive circuit 222 are built in the vertical p-channel MOS-FET chip 223p and the vertical n-channel MOS-FET chip 223n.

The mount layout of the driver IC 2 of this embodiment will be described below. In this embodiment, the upper arm IC chip 210 and the lower arm IC chip 220 are disposed on the isolation wiring board 24 having a rectangular shape side by side in the lengthwise direction thereof. Those chips are electrically connected by wires 26 to a plurality of bonding pads 27 exposed on the surface of the isolation wiring board 24. The MOS-FET chip 230 is disposed between the upper arm IC chip 210 and the lower arm IC chip 220 in sandwiched relation or in an opposed relation to both the chips in the lengthwise direction of the isolation wiring board 24, and is fixed onto the isolation wiring board 24 by a connecting member 25'. The MOS-FET chip 230 is electrically connected by wires 26 to a plurality of bonding pads 27 exposed on the surface of the isolation wiring board 24.

The MOS-FET chips 213n, 213p, 223n, 223p are disposed in one lateral end portion of the rectangular isolation wiring board 24 in the direction of a short side thereof side by side in the direction in which the upper arm IC chip 210 and the lower arm IC chip 220 are arranged in a spaced relation. In addition, the MOS-FET chips 213n, 213p are disposed on the rectangular isolation wiring board 24 in an area extending in the lengthwise direction thereof opposite to the upper arm IC chip 210. Also, the MOS-FET chips 223n, 223p are disposed on the rectangular isolation wiring board 24 in an area extending in the lengthwise direction thereof opposite to the lower arm IC chip 220.

By arranging the MOS-FET chips 213n, 213p, 223n and 223p on the isolation wiring board 24 as described above, this embodiment can also minimize the distance from each chip to a corresponding external output terminal 28'.

In the above-mentioned embodiment, the sealing-off member 29 serves mainly to protect the fixed portions and the bonding portions against not only a hot and humid atmospheres during storage and operation after assembly, but also mechanical and thermal impacts during transportation and the operation. In this embodiment, the sealing-off member 29 has an additional purpose of ensuring and maintaining high voltage isolation between the chips and between the wiring patterns. For example, when $V_{CCH}$ takes a high voltage of about 300 V, a withstand voltage of about 600 V is usually required between the upper and lower arms. To realize such a high withstand voltage, in addition to simply isolating the upper and lower arm from each other through a space and a substrate creepage surface, a resin is filled to not only prevent a short-circuiting caused by a foreign matter, but also to keep isolation for a long term even under an atmosphere with, e.g., a high humidity bias. Thus, particularly when used in applications requiring a high withstand voltage, the driver IC is preferably packaged in the sealing-off member 29 as appropriate.

Figure 8:
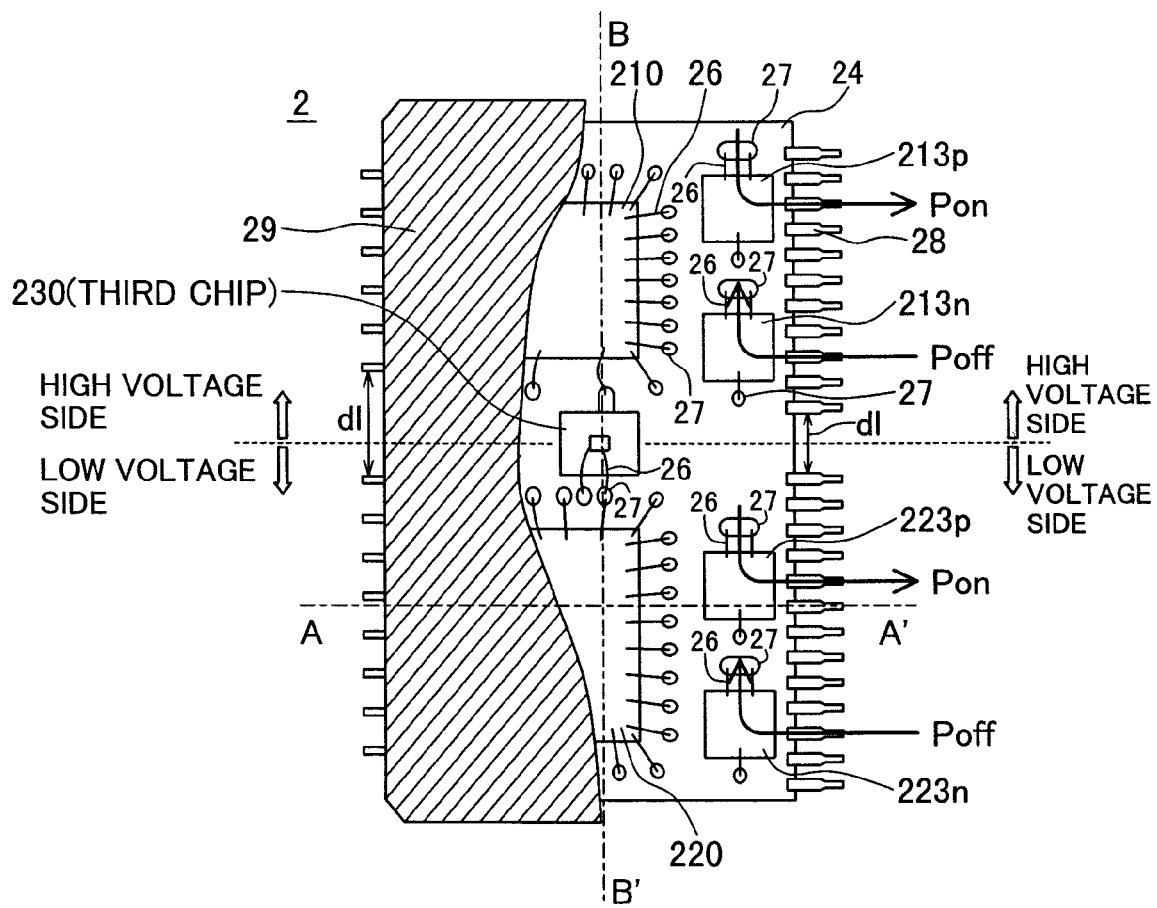
FIG. 8 is a plan view partly broken away to show the mount layout of a driver IC according to a second embodiment of the present invention.
Figure 9:
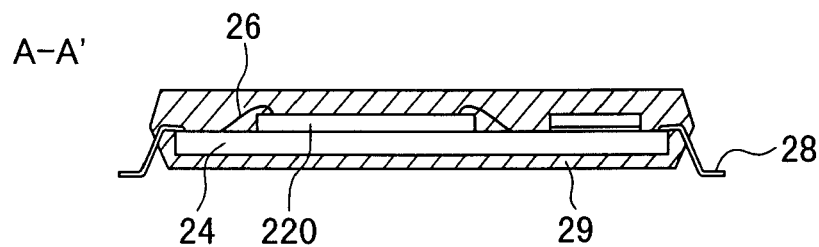
FIG. 9 is a sectional view taken along the line A-A' in FIG. 8.
Figure 10:
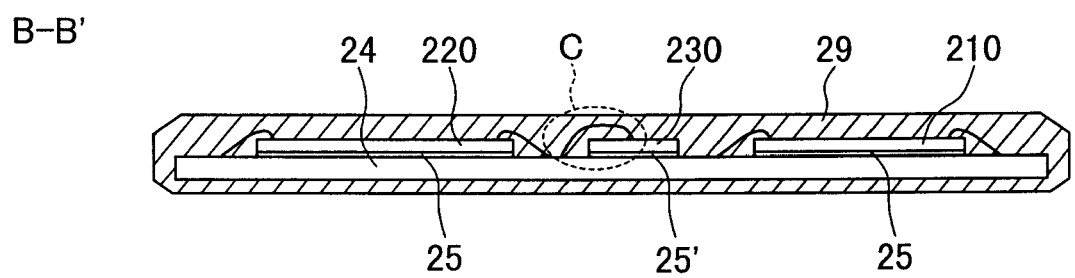
FIG. 10 is an enlarged sectional view taken along the line B-B' in FIG. 8.

In FIG. 8, d1 represents a distance between lead terminals. This distance is set to a value with a sufficient allowance against tracking breakdown along the creepage surface of the sealing-off resin, creepage breakdown on the wiring board surface, and spatial dielectric breakdown between terminals when the sealing-off resin is peeled off, etc. In FIG. 11, d1 represents a distance between wires on the substrate. This distance is set to a value with a sufficient allowance against creepage breakdown on the wiring board surface when the sealing-off resin is peeled off, etc. Further, in FIG. 11, d2 represents a minimum distance between the wire 26 (low potential) and a lateral side (high potential) of the MOS-FET chip 230. With the operation of the driver IC 2, a high-voltage AC voltage is applied to the sealing-off member 29 for isolating the portion between those low- and high-potential parts. If d3 is small, a parasitic capacitance between the wire 26 and the drain electrode of the MOS-FET chip 230 is increased.

As shown in FIG. 12, when the wire 26 constitutes gate wiring, a parasitic capacitance 231 is present between the gate and the drain, and when the wire 26 constitutes source wiring, a parasitic capacitance 232 is present between the source and the drain. If d3 is small, there is a possibility that the parasitic capacitances 231, 232 are increased to such an extent as affecting the operation of the driver IC. For that reason, d3 must be set to a value with a sufficient allowance, taking into account the isolation of the sealing-off member 29 against the AC voltage, the influences of the parasitic capacitances 231, 232 upon the operation of the driver IC, etc. In this embodiment, a hard Au wire is selected as the wire 26 for the MOS-FET chip 230, and the height of a wire loop is set to a larger value than that in other portions so that a sufficient value of d3 is ensured. Practically, in this embodiment, d3 is set to a value in the range of 50 to 3000 μm depending on the withstand voltage of the driver IC.

The source and drain of the MOS-FET chip 230 are electrically connected to the low voltage terminal 30L of the main power supply and one terminal of the current sensing circuit 211, respectively. The other terminal of the current sensing circuit 211 is electrically connected to the high potential side of the power supply 34H in the upper arm drive circuit. When a drive signal outputted from the drive signal processing circuit 224 is applied to the gate of the MOS-FET chip 230, the MOS-FET in the level shift circuit 20 is turned on, whereupon a signal transfer current flows to the current sensing circuit 211. In the current sensing circuit 211, the signal transfer current is converted to a voltage that is supplied to the drive section of the upper arm drive circuit 212. Thus, the first power switching device is brought into a turned-on state. The MOS-FET in the level shift circuit 20 serves to change (shift) a signal voltage (level) from a low voltage to a high voltage with the internal resistance thereof, and to bear such a potential difference.

The internal resistance of the MOS-FET chip 230 tends to increase as the withstand voltage (i.e., the potential difference) between the drain and the source increases. Therefore, a loss during signal transfer is not reduced unless the current flowing the MOS-FET chip 230 is reduced. In this embodiment, the loss is suppressed to be not larger than 1 W by employing the MOS-FET chip 230 that has a high withstand voltage (1000 V or higher) and can hold down the signal transfer current therein to a small current comparable to that in the upper arm IC chip 210 and the lower arm IC chip 220.

This embodiment, described above, can also provide similar advantages to those obtained with the above-mentioned embodiment. In addition, with this embodiment, since the MOS-FET chip 230 is constituted as a separate vertical chip, it is possible to avoid the problem in a production process, which has been caused by the operation at a higher voltage and inevitable with the known driver circuit in the IC form.

More specifically, in each of the upper arm IC chip 210 and the lower arm IC chip 220, because the withstand voltage within the IC is about several tens V, neither an expensive isolation substrate, such as a DI or SoI chip, nor a special voltage withstand structure, such as FLR, are required, and those chips can be produced in accordance with ordinary process rules. Accordingly, this embodiment can realize driving at a higher speed and a smaller loss and a reduction in size of the chip. Further, with this embodiment, since the MOS-FET chip 230 can be formed of a vertical MOS-FET chip having a higher yield, a lower production cost, better characteristics and a higher withstand voltage than those when the MOS-FET chip 230 is built on an insulation substrate, it is also possible to increase the area efficiency as compared with the case employing the known horizontal MOS-FET chip.

Moreover, with this embodiment, since the high withstand voltage IC chip 200 is separated into the upper arm IC chip 210, the lower arm IC chip 220, and the MOS-FET chip 230, noise immunity can be improved. In the known driver circuit in the IC form, because the high voltage section and the low voltage section coupled to each other through parasitic capacitance are present within the same semiconductor chip, there is a substantial possibility that the IC may malfunction due to a noise current caused by a voltage change (dv/dt). On the other hand, in the driver circuit in the IC form according to this embodiment, a sufficient isolation distance can be secured between the high voltage section and the low voltage section, and the parasitic capacitance between them can be reduced to a negligible level. As a result, it is possible to improve the noise immunity and to ensure reliability in operation at a withstand voltage level (over 1000 V).

Embodiment 3

Figure 14:
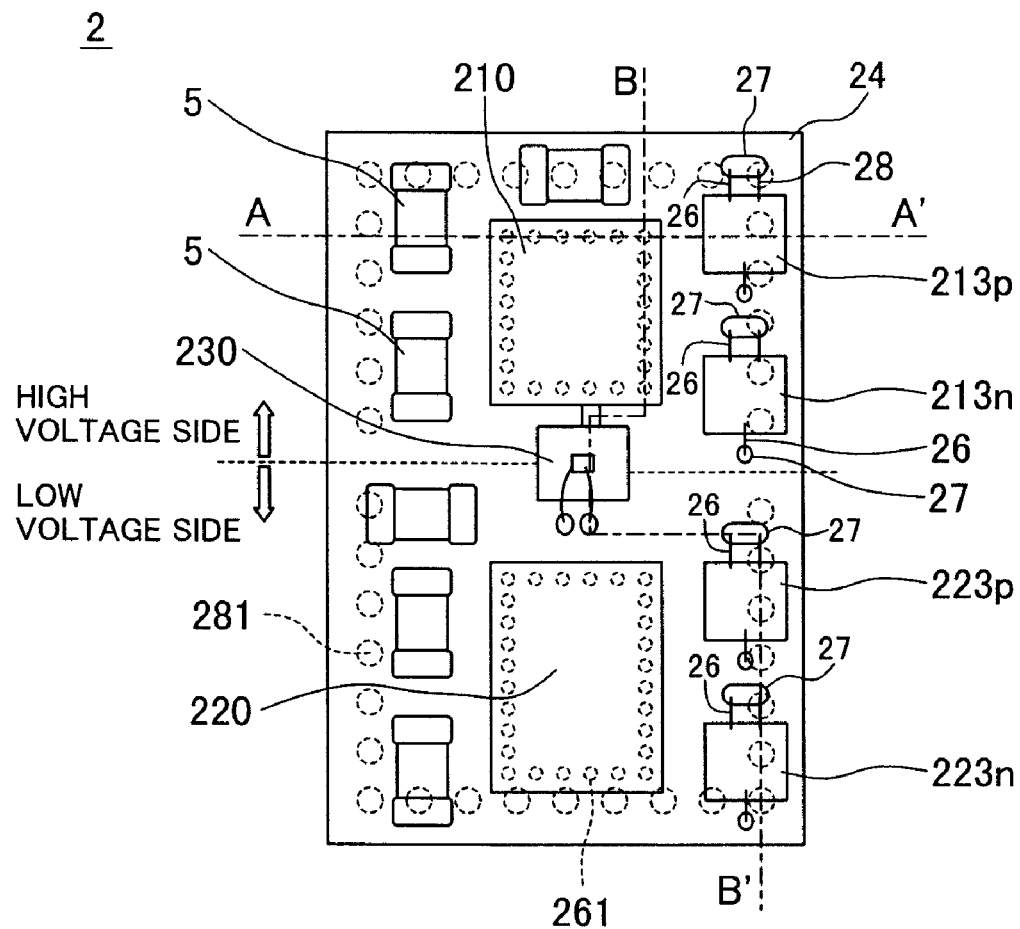
FIG. 14 is a plan view showing the mount layout of a driver IC according to a third embodiment of the present invention.
Figure 15:
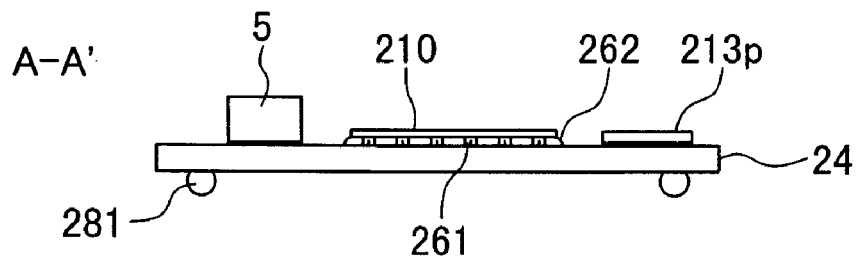
FIG. 15 is a sectional view taken along the line A-A' in FIG. 14.
Figure 16:
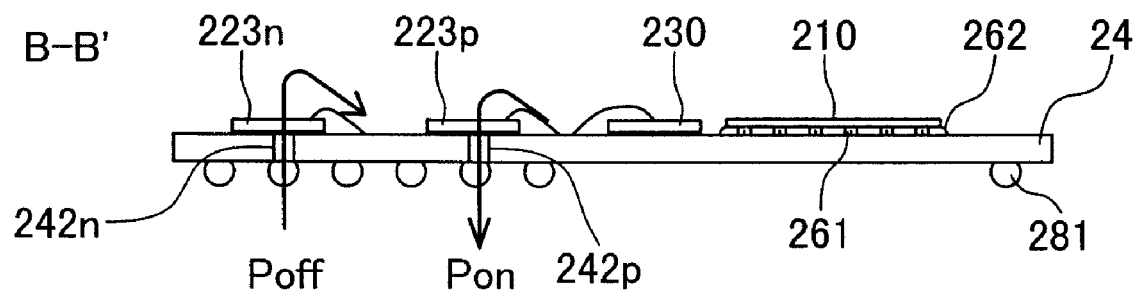
FIG. 16 is a sectional view taken along the line B-B' in FIG. 14.
Figure 17:
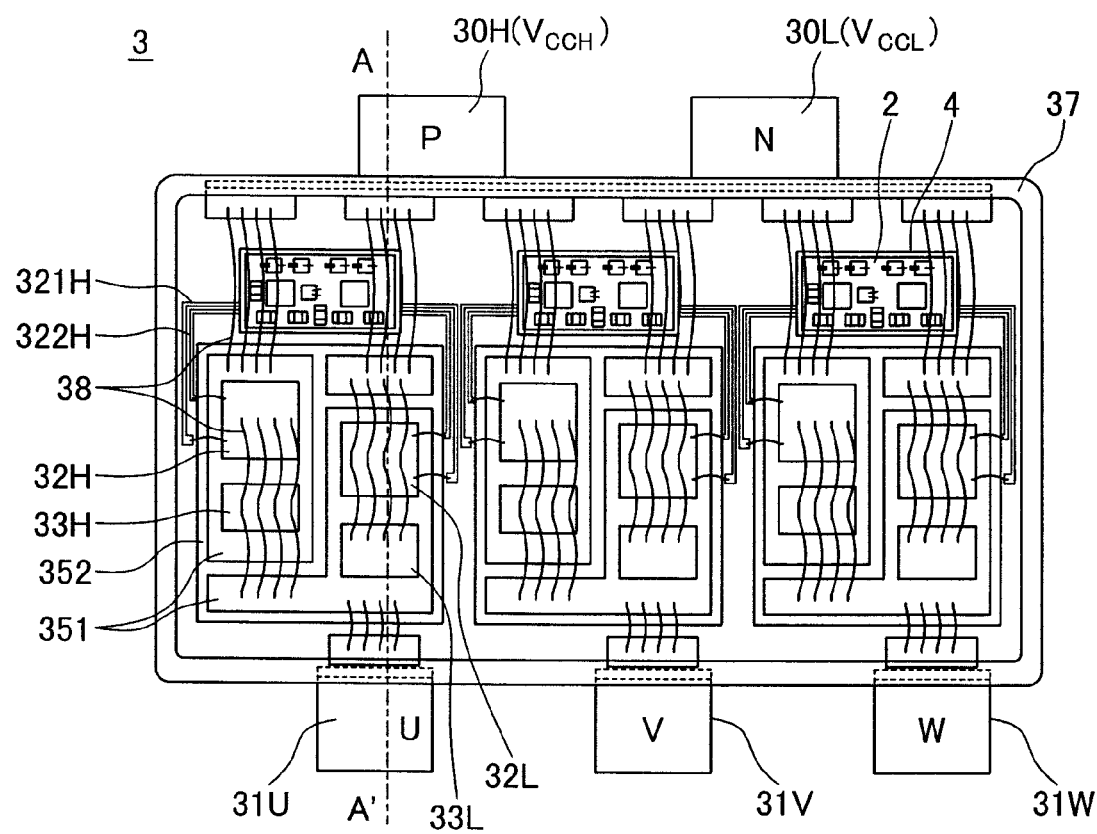
FIG. 17 is a plan view showing the mount layout of an inverter in which the driver IC shown in FIG. 14 is mounted as a driver circuit.
Figure 18:
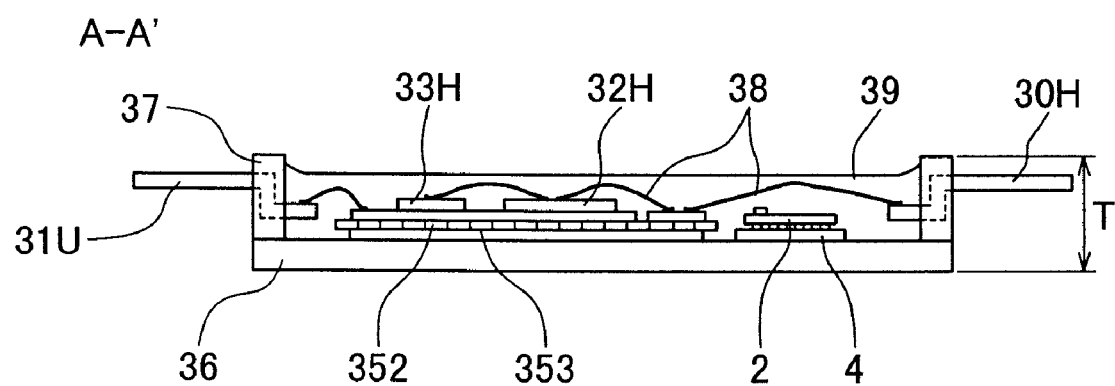
FIG. 18 is a sectional view taken along the line A-A' in FIG. 17.

A third embodiment of the present invention will be described with reference to FIGS. 14 through 18. FIGS. 14 through 16 show the construction of a driver IC of this embodiment. FIGS. 17 and 18 show the construction of an inverter of this embodiment. In the following, only the construction differing from that of the above-mentioned embodiments will be described and a description of the remaining similar construction is omitted.

This embodiment is an improved version of the second embodiment. The upper arm IC chip 210 and the lower arm IC chip 220 are each connected onto the isolation wiring board 24 by facedown (flip-chip) bonding with solder balls 261 (in BGA (Ball Grid Array)). With this embodiment thus constructed, since the wires and the bonding pads are omitted, the occupancy area of the upper arm IC chip 210 and the lower arm IC chip 220 is reduced. Also, with this embodiment, such a reduction of the occupancy area enables the passive parts 5 for filtering, which are mounted on the wiring board 4 in the above-mentioned embodiments, to be disposed within the same package. The passive parts 5, such as chip resistors and chip capacitors, are disposed to provide the functions of a noise filter for the control power supply and of a control timer, and hence contribute to enhancing the function of the driver IC 2 and increasing an added value.

A resin 262 is filled between the upper arm IC chip 210 or the lower arm IC chip 220 and the wiring board 24. With this embodiment thus constructed, thermal strains acting on the solder balls 261 can be relieved and reliability of the connection in those bonding areas can be improved.

Further, this embodiment uses solder balls as external output terminals 281. With this embodiment thus constructed, the inductance on the current path leading to the outside from each of the MOS-FET chips 213*p*, 213*n*, 223*p* and 223*n* is reduced. Note that when the first and second power switching devices are turned on and off, currents flow in the same directions as those described above in the foregoing embodiment.

In this embodiment, the driver IC 2 is not molded in a sealing-off member and is fixed onto the base plate 36 through the wiring board 4. Stated another way, this embodiment has a structure that the silicone resin 39 poured in the case 37 by potting in a final production step of the inverter 3 serves also to isolate the high voltage section and the low voltage section of the driver IC 2 from each other. Additionally, in this embodiment, a printed circuit board is used as the wiring board 4.

This embodiment, described above, can also provide similar advantages to those obtained with the above-mentioned embodiments. In addition, with this embodiment, since the passive parts 5 for the functions of a noise filter and a control timer are built in by employing the BGA mounting when the driver IC 2 is packaged, it is possible to reduce the mount area, including the wiring board 4 as well, in comparison with the known large-sized driver circuit, and to realize a reduction in size and cost of the inverter 3. Furthermore, with this embodiment, since the reduction in size of the driver circuit increases the EMI resistance, a possibility of malfunction caused by noises can be reduced even in the operation at a high voltage (e.g., 1700 V).

Note that, in the drawings, only the IGBT's to be driven are shown, while loads connected to the IGBT's, the construction taking part in turning-off control, and the construction of other IGBT devices are omitted.

According to the driver IC of the present invention, a large current driving ability can be built in a smaller semiconductor package, and a circuit for controlling the gate voltage can also be integrated.

Embodiment 4

Figure 19:
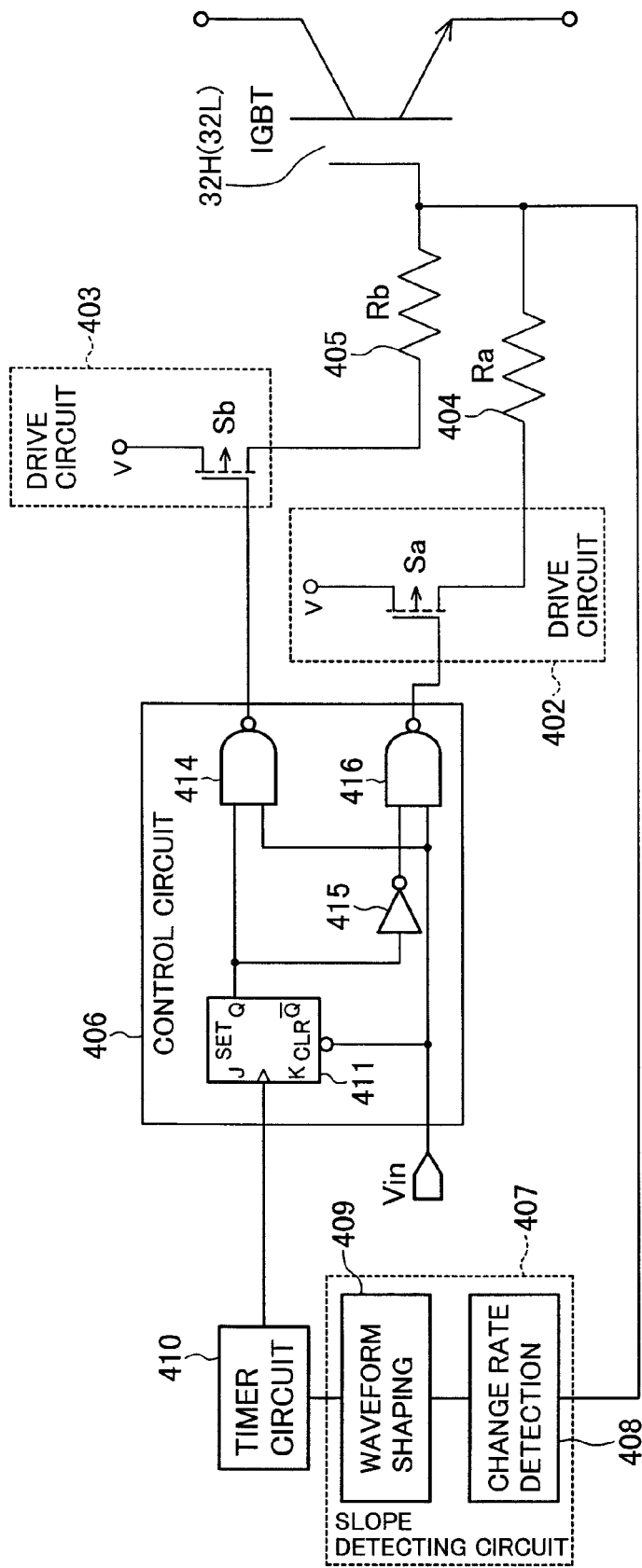
FIG. 19 is a circuit diagram showing the mount layout of a driver IC according to a fourth embodiment of the present invention.

A drive system of this embodiment, shown in FIG. 19, comprises a drive circuit 402, a drive circuit 403, resistances 404 and 405 for connecting the drive circuit 402 and the drive circuit 403 to the gate of the IGBT 32H (32L), a gate power supply V, a control circuit 406 for controlling the operations of the drive circuits, a slope detecting circuit 407, and a timer circuit 410 for transferring an output of the slope detecting circuit 407 to a later stage after the lapse of a preset time.

The slope detecting circuit 407 comprises a change rate detecting circuit 408 for detecting a time change rate of the gate voltage of the IGBT 32H (32L), and a waveform shaping circuit 409 for shaping an output waveform from the change rate detecting circuit 408.

If an output signal of the change rate detecting circuit 408 is at a level sufficient for being transferred to the stage downstream of the slope detecting circuit 407, the waveform shaping circuit 409 may be dispensed with.

The control circuit 406 includes a logical circuit which receives a turning-on input signal Vin and the output of the slope detecting circuit 407, and which decides the timing of switching over the drive circuit, to thereby switch over the drive circuit 402 and the drive circuit 403 from one to the other in accordance with the decided timing.

A resistance value Rb of the gate resistance 405 is set to be smaller than a resistance value Ra of the gate resistance 404.

While each of the drive circuits is constituted as a pMOS transistor in this embodiment, it may be of course replaced with any other suitable device having the switch function.

It is not essential to employ exactly the same construction as that illustrated in this embodiment, so long as any other suitable circuit block has similar functions.

The operation of this embodiment will be described below with reference to FIG. 20.

In this embodiment, the timing of switching over the drive circuit 402 and the drive circuit 403 from one to the other is decided by detecting the time change rate of the gate voltage of the IGBT 32H (32L).

The gate voltage of the IGBT 32H (32L) in an off-state is constant. First, when an on-signal Vin is inputted, an output of an NAND gate 416 takes a Low level because an output of the change rate detecting circuit 408 takes a Low level and an output of a JK flip-flop 411 also takes a Low level.

As a result, a pMOS transistor Sa is turned on, whereby the drive circuit 402 is operated and the gate resistance 404 having the resistance value Ra is made effective.

Figure 20:
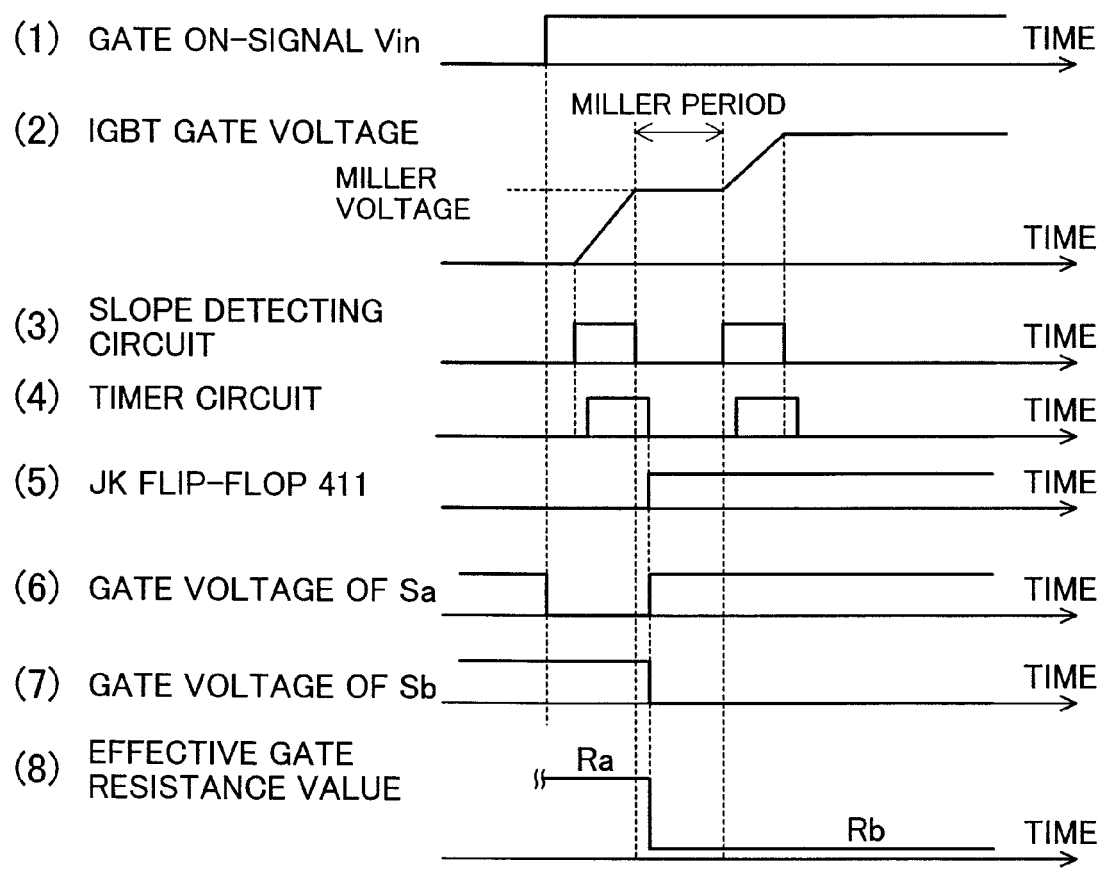
FIG. 20 is a set of charts showing waveforms measured at various points in the fourth embodiment of the present invention.

Consequently, the IGBT 32H (32L) comes into the turning-on operation and, as shown at (2) in FIG. 20, the gate voltage starts to rise.

The gate voltage is inputted to the change rate detecting circuit 408, whereupon the change rate detecting circuit 408 detects a change rate of the gate voltage and produces an output waveform as shown at (3) in FIG. 20.

In order to perform switching-over of the drive circuit during a Miller period in which the gate voltage is held constant during the turning-on operation, the output of the JK flip-flop 411 is turned to a High level at falling of a first pulse signal.

On that occasion, for the purpose of switching over the drive circuit during the Miller period, the output of the slope detecting circuit 407 is transferred to the logical circuit in the later stage after the lapse of the preset time, which is counted by the timer circuit 410.

Responsively, an output of an inverter (NOT circuit) 415 takes a Low level, whereby an output of a NAND gate 416 takes a High level and the drive circuit 402 is stopped. At the same time, because the output of the JK flip-flop 411 is inputted to a NAND gate 414, the gate potential of a pMOS transistor Sb is turned to a Low level, and the drive circuit 403 is started up to make the resistance 405 effective.

Thus, the effective gate resistance of the IGBT 32H (32L) is switched over from the large resistance value Ra to the small resistance value Rb during the Miller period.

More specifically, in an initial stage of the turning-on operation, the IGBT 32H (32L) is driven through the large resistance value Ra, and the current rises moderately. In spite of floating inductance being present on the wiring, etc., therefore, a highly reliable drive system can be realized in which noises are suppressed to be small and a risk of malfunction or breakdown is held down to a low level.

Such a driving method is generally called "soft switching". By employing the soft switching, a risk of malfunction or breakdown caused by noises can be reduced, while the switching time is prolonged and the switching loss is increased.

In contrast, with this embodiment, at the time reaching a state where large noises are no longer caused, the drive circuit is switched over such that the effective gate resistance of the IGBT 32H (32L) is changed to become small. Therefore, the soft switching can be realized without increasing the switching loss.

INDUSTRIAL APPLICABILITY

According to the present invention, an integrated circuit for driving a semiconductor device can be provided which is adaptable for demands, such as a higher output (larger current), a higher voltage, and a smaller loss, and has a small size, is produced at a low cost, and has high reliability. A power converter including such an integrated circuit can also be provided.

What is claimed is:

1. An integrated circuit having a plurality of circuit elements integrated therein for driving a semiconductor device comprising at least first and second semiconductor elements that are connected in series, wherein:
    said integrated circuit is constructed such that circuit elements that drive said semiconductor device are formed in at least one first semiconductor chip, and other circuit elements of said integrated circuit are formed in at least one second semiconductor chip that is separate from said at least one first semiconductor chip;
    said plurality of circuit elements comprise a high-voltage side circuit that includes circuit elements for supplying drive power to said first semiconductor element and low-voltage side circuit that includes circuit elements for supplying drive power to the second semiconductor element; and
    at least the circuit elements that drive said semiconductor device are formed in respective semiconductor chips that are separate from respective semiconductor chips in which said other circuit elements of said high-voltage side circuit and said other current elements of said low-voltage side circuit are formed.

2. The integrated circuit according to claim 1, wherein: said at least one first semiconductor chip and said at least one second semiconductor chip are molded into insulating material.

3. The integrated circuit according to claim 1, wherein:
    said plurality of circuit elements includes a drive signal processing circuit element for processing a drive signal which controls driving of said semiconductor device; and
    said drive signal processing circuit element is included in said low voltage side circuit.

4. The integrated circuit according to claim 1, wherein:
    said plurality of circuit elements includes a level shift circuit element for shifting voltage of a drive signal which controls drive of said semiconductor device from low voltage side to high voltage side; and
    said level shift circuit element is installed in a third semiconductor chip which differs from said first semiconductor chip and said second semiconductor chip.

5. The integrated circuit according to claim 4, wherein said at least one first semiconductor chip, said at least one second semiconductor chip and said third semiconductor chip are molded into insulating material.

6. The integrated circuit according to claim 4, wherein said third semiconductor chip has a vertical structure.

7. The integrated circuit according to claim 1, wherein:
    said plurality of circuit elements includes a current detecting circuit element which detects current of a drive signal output from said level shift circuit element; and
    said current detecting circuit element is included in said high voltage side circuit.

8. The integrated circuit according to claim 1, wherein said at least one first semiconductor chip is disposed closer to an external connection terminal than are said second semiconductor chip.

9. The integrated circuit according to claim 1, wherein said at least one first semiconductor chip has a vertical structure.

* * * * *